(12) United States Patent
Feiweier

(10) Patent No.: US 10,393,840 B2
(45) Date of Patent: Aug. 27, 2019

(54) MAGNETIC RESONANCE APPARATUS AND METHOD FOR ACQUIRING MEASUREMENT DATA DURING SIMULTANEOUS MANIPULATION OF SPATIALLY SEPARATE SUB-VOLUMES

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 294 days.

(21) Appl. No.: 15/281,908

(22) Filed: Sep. 30, 2016

(65) Prior Publication Data

US 2017/0089996 A1 Mar. 30, 2017

(30) Foreign Application Priority Data

Sep. 30, 2015 (DE) .................. 10 2015 218 852

(51) Int. Cl.
| | | |
|---|---|---|
| *G01V 3/00* | (2006.01) | |
| *G01R 33/54* | (2006.01) | |
| *G01R 33/483* | (2006.01) | |
| *G01R 33/58* | (2006.01) | |

(52) U.S. Cl.
CPC ....... *G01R 33/543* (2013.01); *G01R 33/4835* (2013.01); *G01R 33/583* (2013.01)

(58) Field of Classification Search
CPC .................................................. G01R 33/543
USPC ........................................ 324/309, 307, 306
See application file for complete search history.

(56) References Cited

U.S. PATENT DOCUMENTS

| | | | |
|---|---|---|---|
| 9,035,650 B2* | 5/2015 | Popescu ............. | G01R 33/5611 324/307 |
| 2010/0286802 A1 | 11/2010 | Feiweier et al. | |
| 2016/0091584 A1 | 3/2016 | Feiweier | |
| 2016/0091586 A1 | 3/2016 | Benner et al. | |
| 2016/0091587 A1 | 3/2016 | Benner et al. | |
| 2016/0091590 A1 | 3/2016 | Benner et al. | |
| 2017/0010340 A1* | 1/2017 | Eichner ................ | G01R 33/288 |

(Continued)

OTHER PUBLICATIONS

Larkman et al, "Use of Multicoil Arrays for Separation of Signal from Multiple Slices Simultaneously Excited," Journal of Magnetic Resonance Imaging, vol. 13, pp. 313-317 (2001).

(Continued)

*Primary Examiner* — Louis M Arana
(74) *Attorney, Agent, or Firm* — Schiff Hardin LLP

(57) ABSTRACT

In a magnetic resonance method and apparatus, a control computer for a data acquisition scanner automatically determines sequence control data, for a control protocol that has been loaded into the control computer, that define different functional sub-sequences of data acquisition sequence, the sub-sequences causing nuclear spins in at least two sub-volumes of a subject to be simultaneously manipulated or used in order to acquire magnetic resonance data. For each sub-sequence, the computer determines a respective effective volume dependent on the respectively associated sub-volumes, and determines applicable underlying conditions from which control signals are generated that locally optimize the sub-sequences for each effective volume.

9 Claims, 3 Drawing Sheets

(56) References Cited

U.S. PATENT DOCUMENTS

2018/0017653 A1* 1/2018 Chen .................. G01R 33/4835

OTHER PUBLICATIONS

Feinberg et al., "Simultaneous Echo Refocusing in EPI," Magnetic Resonance in Medicine, vol. 48, pp. 1-5 (2002).
Souza et al., "SIMA: Simultaneous Multislice Acquisition of MR Images by Hadamard-Encoded Excitation," Journal of Computer Assisted Tomography, vol. 12, Nr. 6, pp. 1026-1030 (1988).
Wu et al., "Wideband MRI: A New Dimension of MR Image Acceleration," Proc. ISMRM, vol. 17, p. 2678 (2009).

\* cited by examiner

MAGNETIC RESONANCE APPARATUS AND METHOD FOR ACQUIRING MEASUREMENT DATA DURING SIMULTANEOUS MANIPULATION OF SPATIALLY SEPARATE SUB-VOLUMES

BACKGROUND OF THE INVENTION

Field of the Invention

The invention concerns a method, a magnetic resonance apparatus and an electronically readable data storage medium for acquiring measurement data from a subject under examination by operation of a magnetic scanner, wherein the magnetization in at least two sub-volumes of a subject under examination to be examined is simultaneously manipulated and/or used to acquire the measurement data by execution of a sub-sequence.

Description of the Prior Art

Magnetic resonance (MR) technology is a known modality that can be used to generate images of the inside of a subject under examination. In simple terms, this is done by placing the subject under examination in a magnetic resonance scanner in a strong, static, homogeneous main magnetic field, also called the B0 field, at field strengths of 0.2 Tesla to 7 Tesla and higher, with the result that the nuclear spins of the subject are oriented along the basic magnetic field. In order to induce nuclear spin resonances, the subject under examination is exposed to pulses of radio frequency radiation (RF pulses), e.g. for the purpose of excitation or refocusing. The signal that results from the induced nuclear spin resonances are detected (received) and entered into a memory in a format known as k-space data. The k-space data are used as the basis for reconstructing MR images or obtaining spectroscopic data. Rapidly switched magnetic gradient fields are superimposed on the basic magnetic field for spatial encoding of the measurement data. The recorded measurement data are digitized and stored as complex numerical values in a k-space matrix. An associated MR image can be reconstructed from the k-space matrix, populated with values, using e.g. a multidimensional Fourier transform.

All these technical subsystems, e.g. for controlling the gradient and for controlling the RF transmit/receive process, must be suitably addressed in a coordinated manner by a control computer. The control computer must also make the settings and switching operations needed for a specific imaging process for each of the subsystems, each at the correct time. Usually the volume to be imaged in an imaging procedure is captured in sub-volumes, for instance in a number of slices for 2D imaging or in a number of "slabs" for 3D imaging. The sub-volumes captured in this way are then combined to form a total volume. Sub-volumes may also be defined, for example, by "Regions of Interest" (ROI) or even "Volumes of Interest" (VOI), which can be defined specifically by the operator. Moreover, defining local saturation regions or local preparation or labeling pulses in magnetic resonance systems results in additional sub-volumes.

For this purpose, sequence control data, usually based on what is known as a measurement protocol, can be entered into the control computer for coordinated control. The sequence control data define various functional sub-sequences of a complete measurement sequence. For a magnetic resonance acquisition, a first sub-sequence may be, for example, a pulse sequence that locally achieves saturation of particular spins in a specific region. Further sub-sequences may contain, for instance, specific preparation pulses, and yet further sub-sequences are used for successive excitation and for receiving the magnetic resonance signals in different slices or slabs.

Clinical diagnostics require MR imaging techniques and MR spectroscopy techniques that allow maximum acquisition quality in minimum time. Unfortunately, these two requirements are often mutually exclusive, because short acquisition times usually involve compromises over the achievable quality of the measurement data.

In order to reduce the measurement times, MR measurement techniques in which the spins are excited in a number of sub-volumes, e.g. in a number of slices, simultaneously or in quick succession, and the signals thus generated are subsequently captured simultaneously or at short time intervals, have recently experienced a renaissance (by combining with parallel imaging techniques). These techniques, also called slice multiplexing techniques or simultaneous multislice techniques, are characterized by, at least during a time segment of the measurement, the magnetization in two regions, which are spatially separate at least in part, is simultaneously manipulated and/or used for the measurement data acquisition process in a targeted manner. Unlike these techniques, in conventional, established "multislice imaging", the signal is acquired from at least two slices alternately, i.e. fully independently from one another, with a correspondingly longer measurement time.

In simultaneous multislice techniques, the captured signal is associated with the individual slices using k-space based parallel imaging algorithms, for example, (e.g. GRAPPA, "Generalized Autocalibrating Partially Parallel Acquisition"), which exploit the spatial receive profiles of at least two receive coil elements. This approach can be used to image a number of slices—for instance two or three or more—in the same time that would otherwise be taken to capture only one slice. For just a few simultaneously captured slices, the noise additionally induced in the acquired measurement data by the reconstruction algorithms, which is characterized by what is known as the g-factor, is practically negligible. Other approaches, such as Hadamard encoding, broadband data acquisition or simultaneous echo refocusing are known, for example, from the following publications:

Hadamard encoding (e.g. Souza et al., J. CAT 12:1026 (1988)): Two (or more) slices are excited simultaneously; a defined signal phase is applied to each slice by suitable design of the RF excitation pulses. The magnetization signal is received simultaneously from both slices. A similar second excitation of both slices is performed but with a modified relative signal phase in the slices. The rest of the imaging process (phase encoding steps) is performed as usual, and the method can be combined with any acquisition techniques ((multiple) gradient echo, (multiple) spin echo etc.). From the two acquisitions it is possible to separate the signal information from the two slices using suitable processing operations.

Broadband data acquisition (e.g. Wu et al., Proc. ISMRM 2009:2768): Two (or more) slices are excited simultaneously. The magnetization signal is received simultaneously from both slices. While data is being received, a gradient is activated along the slice normals, which results in separation of the signals from both slices in the frequency domain. The rest of the imaging process (phase encoding steps) is performed as usual, and the method can be combined with any acquisition techniques ((multiple) gradient echo, (multiple) spin echo etc.). From the simultaneously acquired data, it is possible to separate the signals from the two slices using suitable filtering.

Simultaneous echo refocusing (SER, SIR, e.g. Feinberg et al., MRM 48:1 (2002)): Two (or more) slices are excited in quick succession; a defined spatial dephasing is applied to each layer by suitable gradient pulses. The signal from the simultaneously manipulated magnetization is received from both slices at a short time interval apart using suitable gradient circuits. The rest of the imaging process (phase encoding steps) is performed as usual, and the method can be combined with any acquisition techniques ((multiple) gradient echo, (multiple) spin echo etc.). Images of the two slices can be generated as usual from the separately acquired data.

Magnetic resonance-based techniques, both tomographic imaging (MRI, magnetic resonance imaging) and spectroscopy (MRS, magnetic resonance spectroscopy), in general need "benign" underlying physical conditions to ensure optimum possible quality of the acquired data. For example, this applies to at least one of the criteria comprising spatial homogeneity, stability over time and absolute precision of the magnetic fields relevant to MR techniques (B0, the stationary main magnetic field, and B1, the alternating RF magnetic field).

Known measures that can be used to at least partially correct deviations from ideal underlying conditions include both system-specific and subject-specific adjustments. System-specific adjustments seek to correct the actual conditions associated with the MR system used, for instance conditions such as eddy-current induced dynamic field disturbances or gradient sensitivities. Adjustments specific to the subject under examination attempt to correct changes caused by the subject under examination, for instance a patient, introduced into the measurement volume of the MR system, such as susceptibility-related static field disturbances or spatial variations in the RF field.

Such methods for improving the quality of the acquired measurement data in particular by adjustments to the relevant measurement parameters, also for dynamic adjustment of the parameters, have undergone further development in recent years.

DE 10 2009 020 661 B4, for example, describes a method that is used to adapt parameters of a measurement sequence, e.g. in magnetic resonance technology, while the measurement sequence is running. This document also already describes that different functional sub-sequences are normally assigned different effective volumes. In other words, a different sub-volume of the total measurement volume is relevant to each sub-sequence.

It is also possible to adapt measurement parameters while a measurement is running in order to optimize the image quality. The fundamental idea of such dynamic adjustment is to configure the underlying physical conditions such that, preferably at any given time, they are as ideal as possible for the sub-volume that is currently relevant in the measurement process. If during an MR measurement, for example, the spins of a slice are excited and then the generated signal is detected, for this time segment of the MR measurement, the measurement parameters can be optimized to the region defined by the slice. In a subsequent excitation and detection of the next slice, the optimization can then be dynamically adapted accordingly, and so on.

The adjustable measurement parameters include, for example, the modulation frequency of the emitted RF pulses, the demodulation frequency of the received MR signal, scaling factors for the RF pulse amplitude, amplitude distribution and phase distribution of the RF currents on a plurality of transmit elements (if present). As a result of the improved local underlying conditions at any given time, said dynamic adjustments allow significant improvements in the image quality compared with static adjustment settings.

Conventionally, applying said dynamic adjustment methods specifically in combination with the above-mentioned simultaneous multislice techniques is possible only to a limited extent. The image quality improvement achieved by dynamic adjustments turns out to be higher, the smaller the relevant sub-volume in which the measurement parameters are adapted with the aim of achieving optimum conditions. If two or more spatially separate sub-volumes are excited simultaneously, as is the case in simultaneous multislice techniques, then according to known techniques, the relevant volume in which the underlying conditions are meant to be optimized must be chosen to be of a size that encompasses all the sub-volumes. The image quality improvement hence proves to be significantly lower as a result of the adjustment in such a large relevant volume.

SUMMARY OF THE INVENTION

An object of the invention is to allow the aforementioned techniques for reducing the measurement time and improving the quality of the measurement data to be combined without involving compromises.

The method according to the invention for acquiring measurement data from a subject under examination by operation of a magnetic resonance apparatus, wherein the magnetization in at least two sub-volumes of a subject under examination to be examined is simultaneously manipulated and/or used to acquire the measurement data by execution of a sub-sequence, has the following steps.

A control protocol for a measurement data acquisition to be carried out is loaded into a control computer of a magnetic resonance apparatus.

Sequence control data that are relevant to the control protocol are determined in the control computer. The data define different functional sub-sequences of a measurement sequence of the control protocol, by which sub-sequences at least two sub-volumes of the subject under examination to be examined are simultaneously manipulated and/or used to acquire the measurement data.

Effective volumes for each functional sub-sequence are determined in the control computer, taking into account the sub-volumes associated with the particular sub-sequence.

Applicable underlying conditions, for the determined relevant sequence control data and for the effective volumes determined for the associated sub-volumes, are also determined in the control computer.

Control signals for operating the data acquisition scanner of the magnetic resonance apparatus are generated in the control computer on the basis of the relevant sequence control data and the determined effective volumes and the determined underlying physical conditions for performing the measurement sequence, such that the individual sub-sequences are each locally optimized for each effective volume of an associated sub-volume.

The control signals are made available from the control computer as an output in an electronic form for operating the scanner.

The method according to the invention allows dynamic adjustment simultaneously for spatially separate sub-volumes such that the sub-sequence that excites and/or measures the sub-volumes is in each case optimized for each sub-volume and it is hence possible to improve the quality of the acquired measurement data overall. The method according to the invention can also be used to combine multislice techniques with dynamic adjustment of the control signals relevant to the measurement in such a way that a significant improvement in the quality of the acquired measurement data is achieved. The method hence allows measurement data to be acquired with a high level of quality in a short time.

The invention is based on the insight that local variations in the B0 field cannot usually be corrected in dynamic adjustment techniques by switching B0-field shim coils, but it is sufficient in this case to adapt the center frequency for transmitting the RF pulses and/or for receiving the RF signals. Another important insight is that it is fundamentally possible to excite a number of spatially separate sub-volumes, e.g. slices, simultaneously using a comparatively simple complex-valued superposition of the amplitude and phase waveforms of the individual RF pulses.

Considering initially the situation in which only measurement data from a single slice S1 are acquired using dynamic adjustment techniques from the prior art, with the assumption that in this slice S1 there are variations in the mean B0 field (relative to the spatial acquisition region for a static adjustment), it is found that these variations can be corrected by dynamic adjustment of the center frequency of the NCO in the time period from excitation to measurement data acquisition. If the mean field variation in this slice is $\Delta B0(S1)$, the center frequency of the NCO is offset by the corresponding value $\Delta\omega(S1)=\gamma\Delta B0(S1)$ in the time period from excitation to measurement data acquisition.

A universal offset of this nature affects both the frequency of the RF pulses (and, for receiving, the frequency of the demodulation of the signal) and the phase of the RF pulses.

For acquisition of measurement data from a second slice S2 at a separate instant in time, in the prior art, dynamic adjustment techniques would offset the center frequency by the value $$\Delta\omega(S2)=\gamma\Delta B0(S2).$$

If now both slices S1 and S2 are meant to be acquired simultaneously, the prior art envisages at best using a compromise because the respective offsets $\Delta\omega(S1)$ and $\Delta\omega(S2)$ each apply to all the RF signals for transmitting and receiving. Until now, only such a global adjustment to the measurement parameters has been possible in the prior art, even though this also limits the quality achievable for the acquired measurement data.

The method according to the invention succeeds in setting, for a number of simultaneously acquired sub-volumes, in particular slices, in all the sub-volumes simultaneously a value $\Delta\omega(Sn)=\gamma\cdot\Delta B0(Sn)$ that is optimum for each sub-volume.

A magnetic resonance apparatus according to the invention has a data acquisition scanner with a basic field magnet, a gradient coil arrangement, an RF antenna and a control computer designed to implement the method according to the invention.

The present invention also encompasses a non-transitory, computer-readable data storage medium encoded with programming instructions that, when the data storage medium is loaded into a control computer of a magnetic resonance apparatus, cause the control computer to implement the method according to the invention, as described above.

The advantages and embodiments described with regard to the method apply analogously to the magnetic resonance apparatus and to the electronically readable data storage medium.

DESCRIPTION OF THE PREFERRED EMBODIMENTS

Figure 1:
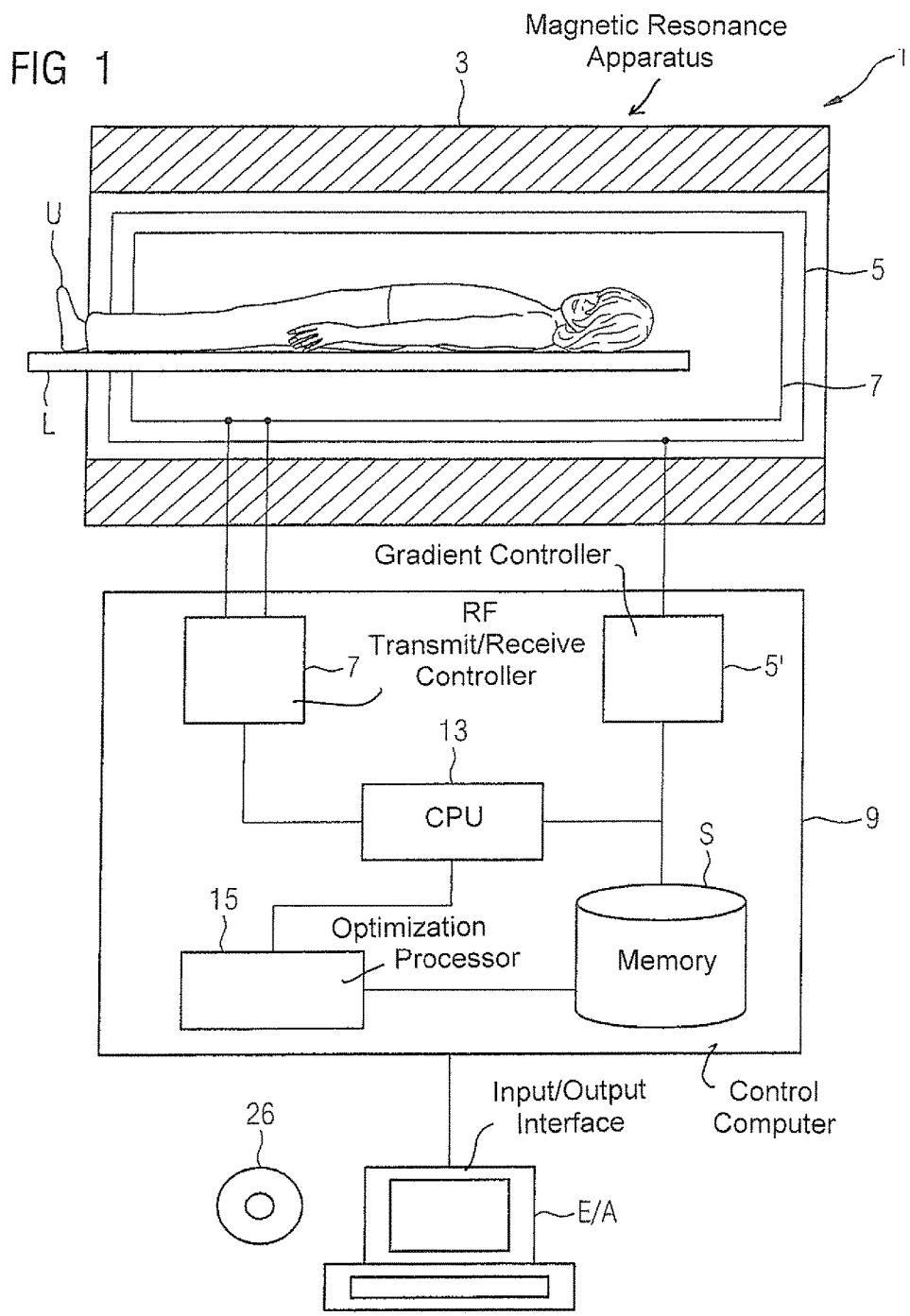
FIG. 1 is a schematic illustration of a magnetic resonance apparatus according to the invention.

FIG. 1 schematically shows a magnetic resonance apparatus I according to the invention. This has a data acquisition scanner having a basic field magnet 3 for generating the basic magnetic field, a gradient coil arrangement 5 for generating the gradient fields, an RF antenna 7 for emitting and receiving RF signals, and a control computer 9 designed to implement the method according to the invention. In FIG. 1, these sub-units of the magnetic resonance apparatus 1 are not shown in detail. For instance, the RF antenna 7 may be formed of a number of sub-units, such as a number of coils, which may either be designed solely to transmit RF signals or solely to receive the induced RF signals, or be designed to do both.

In order to examine a subject under examination U, for example a patient or else a phantom, the subject can be introduced into the measurement volume of the scanner on a couch L.

The control computer 9 is configured to control the magnetic resonance apparatus 1 by controlling the gradient coil arrangement 5 with a gradient controller 5' and to control the RF antenna 7 with an RF transmit/receive controller 7'. The RF antenna 7 can have multiple channels in which signals can be individually transmitted or received.

The RF antenna 7 together with its RF transmit/receive controller 7' is responsible for generating and emitting (transmitting) an alternating RF field that manipulates nuclear spins in the subject under examination U. The center frequency of this alternating RF field, also referred to as the B1 field, must lie close to the resonant frequency of the spins to be manipulated. In order to generate the B1 field, currents are applied to the RF coils, which currents are controlled in the RF antenna 7 by the RF transmit/receive controller 7'. For this purpose, the RF transmit/receive controller 7' comprises a frequency synthesizer, which generates a continuous sinusoidal current at a specific frequency, the center frequency. The frequency synthesizer comprises for this purpose what is known as an NCO (numerically controlled oscillator), which can be used to control the center frequency.

Figure 2:
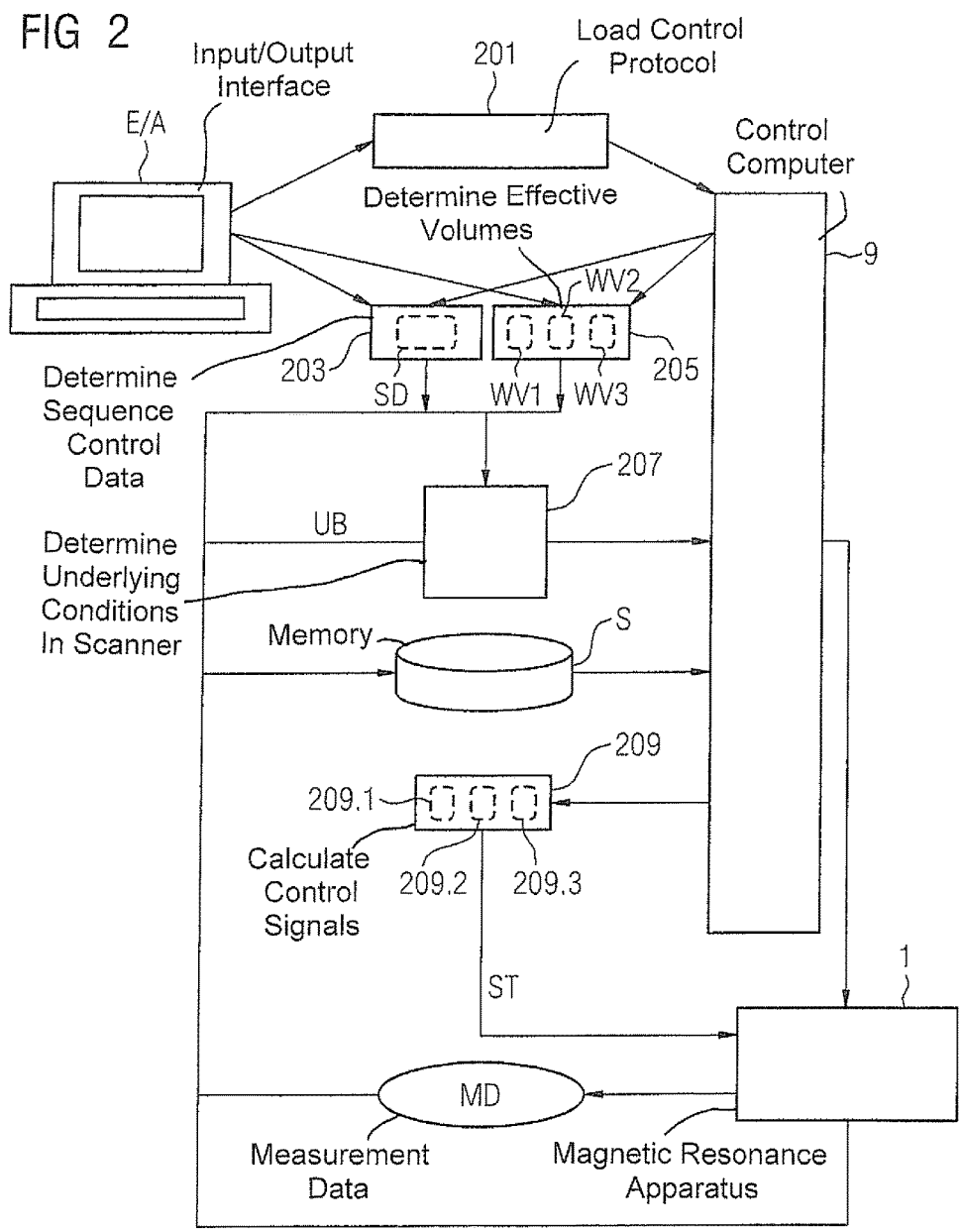
FIG. 2 is a flowchart of the method according to the invention.

In addition, the control computer 9 has an optimization processor 15 that is designed to implement the method according to the invention (see FIG. 2). A central processing unit (CPU) 13 of the control computer 9 is designed to perform all the processing operations needed for the required measurements and determinations. Intermediate results and results required for this purpose or calculated in this process can be saved in a memory S of the control computer 9. The units shown need not necessarily be interpreted as physically separate units, but merely constitute a subdivision into logical units, which can be implemented in fewer physical units or even in just one physical unit.

Via an input/output interface E/A of the magnetic resonance machine 1, it is possible for a user to either control commands into the magnetic resonance apparatus 1 and/or to display results from the control computer 9, e.g. results such as image data or the determined dephasing factors.

The method described herein can be in the form of a computer program, which causes the control computer 9 to implement the particular method when the program code is executed therein. An electronically readable data storage medium 26 has electronically readable control information stored thereon, which information includes at least the computer program as just described.

FIG. 2 is a flowchart of the method according to the invention.

In a first step 201, a control protocol for an acquisition of measurement data MD to be performed is loaded e.g. into the control computer 9 of the magnetic resonance apparatus 1. This can be done by a user making entries via the input/output device E/A such as by selecting and, if applicable, modifying a specific control protocol.

In a further step 203, the sequence control data SD relevant to the loaded control protocol are determined and stored in the memory S, which data define different functional sub-sequences of a measurement sequence belonging to the control protocol. With these sub-sequences, at least two sub-volumes of the subject under examination to be examined are simultaneously manipulated and/or used to acquire the measurement data. In this step, depending on the type of the selected measurement, which e.g. predetermines the sequence type, further acquisition parameters and a body region to be examined, namely the control protocol, it may be practical to perform dynamic adjustment, for example, in order to select different measurement parameters.

In another step 205, effective volumes WV1, WV2, WV3 are determined for each functional sub-sequence, taking into account the sub-volumes associated with the particular sub-sequence, and saved.

Using at least one functional sub-sequence, according to the invention at least two, in particular three or even more, sub-volumes of the subject under examination are manipulated in terms of their magnetization and/or used for the measurement data acquisition process. Thus the at least two sub-volumes manipulated in terms of their magnetization and/or used for the acquisition process are taken into account here at least once for such a sub-sequence. This can be done automatically on the basis of the control protocol. For instance, for a desired multislice measurement, each slice to be acquired can define one such effective volume WV1, WV2, WV3. In determining the effective volumes WV1, WV2, WV3, however, it is also possible to restrict even further the sub-volumes associated with the sub-sequences. Such a restriction can be performed e.g. on the basis of required regions of interest (ROI) or even on the basis of other spatial restrictions that are active in the sub-sequence, such as e.g. regions from which signals are not meant to be received and hence in which e.g. saturation is required. Such restrictions can be defined by the control protocol. Thus directly after specifying the control protocol it is already possible to create and save a list of all the effective volumes WV1, WV2, WV3 that are relevant to each sub-sequence during the measurement process. This is explained below with reference to FIG. 3.

In step 207, applicable, e.g. also prevailing, underlying conditions UB are determined for the determined relevant sequence control data SD and for the effective volumes WV1, WV2, WV3 determined for the associated sub-volumes.

Recourse can be made to the determined effective volumes WV1, WV2, WV3 and the determined required control sequence data SD. For measurement parameters that are to be adapted dynamically, local values for the underlying conditions UB are determined in this step. In some cases this requires extensive calibration measurements. For instance, successive calibration measurements can be used to determine local values for the underlying conditions UB for each associated sub-volume or the respective relevant effective volumes WV1, WV2, WV3. This procedure is a simple and established method but is time consuming and must be repeated when changes are made to the control protocol. By restricting to calibration measurements only for the measurement parameters relevant to the given control protocol, however, the number of calibration measurements to be performed, and hence the effort, involved is again limited. Alternatively, in a one-off effort, for instance, maps of the underlying physical conditions UB can be captured, which then can be used as the database for any sequence control data SD. For example, maps of the $B_0$ field distribution and/or maps of the $B_1$ field distribution can be captured, if applicable the latter for a plurality of elements or even all the elements of a transmit system comprising a plurality of transmit elements. Established calibration measurements can be used in both cases. If underlying conditions data already exists for sub-volumes S1, S2, S3 or for their effective volumes WV1, WV2, WV3 from earlier calibration measurements, the data can be reused without repeating a calibration measurement. Thus calibration data once acquired, for instance data such as underlying conditions already determined for determined sub-volumes S1, S2, S3 or for associated effective volumes WV1, WV2, WV3, can be used for a plurality of measurements.

In step 209, for example in a control device 9 of a magnetic resonance machine 1, control signals ST for the measurement sequence are calculated on the basis of the determined relevant sequence control data SD, the effective volumes WV1, WV2, WV3 determined for the sub-volumes S1, S2, S3 and the relevant, determined prevailing underlying conditions UB, and e.g. saved in the memory S and/or used to control an ongoing measurement by the scanner of the magnetic resonance apparatus 1. The calculation is performed here such that the individual sub-sequences are each optimized locally for each effective volume of an associated sub-volume.

The optimization can also correct for local field variations in the basic magnetic field B0 and/or in the alternating RF field B1.

The control signals ST can be generated (step 209) here before starting the actual measurement by the magnetic resonance machine 1, in which case the generated control signals ST are e.g. loaded from the memory S into the control computer 9 and passed to the magnetic resonance apparatus 1 during the measurement.

It is also possible for the control signals ST to be generated (step 209) as required while the measurement is in progress, and the generated control signals ST are passed to the magnetic resonance apparatus 1 directly for the measurement.

Generating the control signals ST here means adapting at least one parameter of the relevant sequence control data, which specifies the sequence of the sequence modules (e.g. RF pulses, gradient pulses, etc.), per effective volume of each sub-volume of a sub-sequence. The parameters to be adapted here can control the transmission and/or reception of RF signals.

The parameters to be adapted may be, e.g., the center frequency, RF pulse scaling factors and/or the RF pulse current distribution for a "B1 shim". Some explanatory examples are given below.

Thus the relevant sequence control data SD relates to RF pulses of the sub-sequences. Again in this case, sequence control data that controls the transmission of RF pulses are relevant.

In principle, all forms of RF pulses qualify as RF pulses that can be adapted using the method according to the invention in order to increase the quality of the acquired measurement data. RF pulses from the group of RF excitation pulses, RF refocusing pulses, RF suppression pulses for saturation of certain signals (signal components), RF inversion pulses, RF labeling pulses, e.g. for arterial spin labeling, and complex RF pulses are possible as the RF pulses of the sub-sequences. Complex RF pulses mean RF pulses for non-constant slice selection gradients, such as RF pulses localized in two dimensions or three dimensions, or VERSE pulses (VERSE: variable-rate selective excitation), which allow RF pulses having reduced power input (SAR, "specific absorption rate").

In the case of simultaneous excitation of different sub-volumes Sn (n=1, 2, 3, ... ) where a mean field variation in the main magnetic field B0 of $\Delta B0(Sn)$ prevails in the respective sub-volumes, the center frequency, for example, can be adapted initially as described above by the corresponding value $\Delta\omega(Sn)=\gamma\Delta B0(Sn)$.

In order to be able to apply such values locally and simultaneously, which are optimized individually for each sub-volume, the generation of the control signals ST can be superposition of the parameters of the relevant sequence control data, which parameters are adapted per effective volume of each sub-volume Sn of a sub-sequence.

For instance, in a complex-valued superposition of the waveforms of the RF pulses, which are individually adapted for each sub-volume Sn, the respective phase waveforms of the RF pulses can be e.g. modified in such a way that an individual center frequency optimized for the local field variation $\Delta B0(Sn)$ is effectively active also for simultaneously excited sub-volumes.

Taking the simple case in which a slice selection gradient GS applied in a sub-sequence is constant, in which the complex-valued variation over time of an RF pulse is characterized by HF(t), and in which (for the sake of simplicity) two sub-volumes S1 and S2 are excited at the positions z1 and z2, and in which the effective volumes correspond to the respective sub-volumes, it is possible to proceed as follows:

First, the center frequency can be adapted generally in a manner known in the prior art, e.g. as part of a static adjustment.

In order to excite and/or manipulate the currently required sub-volume S1, S2, the RF pulse waveform is modulated for each sub-volume 51, S2. This can be expressed as follows, for example:

S1: $HF1(t)=HF(t)*\exp(i\gamma GSz1t)$,

S2: $HF2(t)=HF(t)*\exp(i\gamma GSz2t)$, whereas stated above, HF(t) is generally the waveform of the required RF pulse, and GS is the slice selection gradient. The modulation is thus achieved by a complex exponential function.

Such a frequency modulation, which is needed to set the slice position, either can be included in the RF pulse waveform by the calculation given immediately above, or alternatively can actually be taken into account in the setting of the NCO.

In order that a center frequency optimized for the local field variation $\Delta B0(Sn)$ can be active for each sub-volume Sn and hence the sub-sequences can each be locally optimized for each effective volume of an associated sub-volume, for the correction for the field variation, this can be taken into account by means of an additional modulation. The locally optimized waveforms of the RF pulses HFn'(t), and hence the RF pulse current distributions, for each of the n sub-volumes, which waveforms are generated on the basis of the sequence control data relevant here, the RF pulse waveforms, relating to transmitting RF signals and on the basis of the determined effective volumes and the determined underlying physical conditions, in this case $\Delta B0(Sn)$, are expressed as follows:

S1: $HF1'(t)=HF1(t)*\exp(i\Delta\omega(S1)t)$,

S2: $HF2'(t)=HF2(t)*\exp(i\Delta\omega(S2)t)$.

Figure 4:
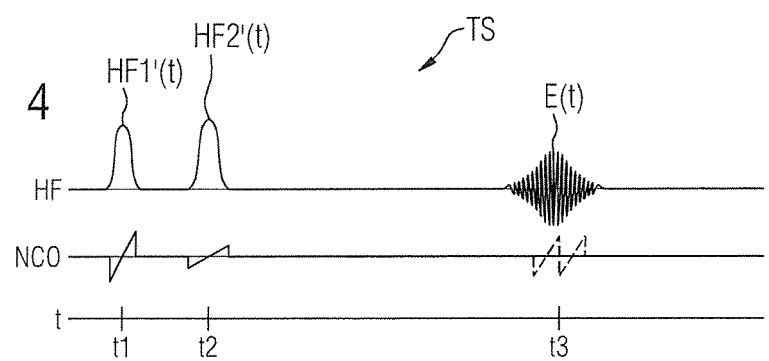
FIGS. 4 and 5 are highly simplified diagrams of sub-sequences that simultaneously manipulate and/or use to acquire measurement data the magnetization in at least two sub-volumes of a subject under examination to be examined.

If the sub-volumes S1, S2 are excited or otherwise manipulated successively (such as e.g. in simultaneous echo refocusing), these values can already be used for the optimized control signal ST. Such a sub-sequence TS is sketched in a highly simplified form on the left in FIG. 4, in which sub-sequence the optimized RF pulse waveforms HF1'(t) and HF2'(t) are applied in succession at sequential times t1 and t2. In this case it is also possible that the NCO setting has already been adapted individually for each RF pulse.

If the sub-volumes S1, S2 are excited simultaneously, the locally optimized waveforms can be superimposed in complex form in order to obtain optimum conditions for each sub-volume. The waveform of the associated RF pulse is then expressed as:

$HF12'(t)=HF1'(t)+HF2'(t)$.

Figure 5:
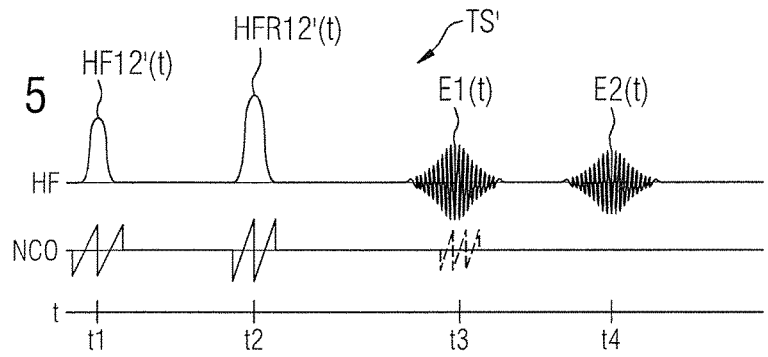

Such a sub-sequence TS' is sketched in a highly simplified form on the left in FIG. 5, in which sub-sequence an RF pulse waveform HF12'(t), which is optimized for both sub-volumes S1 and S2, is applied at one point in time.

If the NCO is not adjusted to a static value, but set, for instance, to a combined value $\Delta\omega(S1, S2)$, e.g. a mean value that combines the respective local frequency differences $\Delta\omega(S1)$ and $\Delta\omega(S2)$, the corresponding difference in the frequency from this combined value can be taken into account in the modulation for the additional correction for the field variation in S1 and S2 for local optimization of the sub-sequences for each sub-volume, i.e. in the calculation of HF1'(t) and HF2'(t) respectively.

Sub-sequences that are locally optimized in this way can be used for example in RF excitation pulses to improve the spatial excitation accuracy, or for example in RF suppression pulses to improve the chemical selectivity.

It is possible for the relevant sequence control data SD also to relate to receiving the measurement data MD in a sub-sequence.

For instance, when receiving a complex-valued signal E(t), referred to as an echo or echo signal, from simultaneously viewed sub-volumes, the phase waveforms are modified in such a way that an individual center frequency optimized for the local field variation is effectively active. An example of such an echo signal E(t) is shown at a time t3 on the right in FIG. 4.

In the known simultaneous multislice techniques, the signals from the simultaneously manipulated slices are received and acquired either simultaneously (e.g. in broadband data acquisition or in parallel imaging in the slice direction) or in quick succession (e.g. in simultaneous echo refocusing). In the case of simultaneous acquisition, suitable algorithms (e.g. GRAPPA) are used here initially to separate or allocate the signal components of the individual slices.

The NCO can again be set in this case on the basis of the results of a static adjustment, for example.

If echo signals E(t) acquired simultaneously in this way have already been separated in a known manner, and thus pre-separated complex-valued data already exists for each sub-volume E_S1(t) and E_S2(t), then control signals ST can be generated such that reception of the measurement data is in each case optimized locally for each sub-volume. Once again, modulation can be used for this purpose to correct for the local field variation $\Delta B0(Sn)$. An optimized receive signal in the sub-volume S1 is thereby obtained, given by $$E\_S1'(t)=E\_S1(t)*\exp(-i\Delta\omega(S1)t).$$

Similarly for the sub-volume S2:

$$E\_S2'(t)=E\_S2(t)*\exp(-i\Delta\omega(S2)t).$$

The receive signals E_S1'(t) and E_S2'(t) optimized in this way can be processed further by the usual means in the subsequent course of the measurement.

Receive signals optimized in this way can improve the spatial imaging accuracy along the read-out direction, for example.

Moreover, during generation of the control signals it is also possible to perform local optimization for ascertaining a relative phase in the acquired measurement data.

Such a relative phase of RF pulses and/or also in receiving data is relevant in various MR techniques. For instance, the phase relationship between RF excitation pulses and RF refocusing pulses, which relationship is meant to be determined from the relative phase, can be used to control coherence pathways in a desired manner. In addition, the relative phase between RF pulses and an associated receive signal or a relative phase between a number of receive signals (e.g. in multi-echo experiments such as EPI) can have an impact on the resultant quality of the measurement data.

If the relative phase is meant to be optimized in such a way that sub-sequences are each locally optimized for each effective volume of an associated sub-volume, the relative phase can be controlled such that in each case the local field variation is effectively taken into account in each effective volume.

To do this, the local phase evolution for each viewed sub-volume must be considered separately.

As an example, the case is again considered in which two sub-volumes S1 and S2 are excited simultaneously at an excitation time t1 by an RF excitation pulse HF12'(t), refocusing is performed at a refocusing time t2 by an RF refocusing pulse rfR12'(t), and echo signals E1(t) and E2(t) are received at respective receive times t3 and t4, as shown in the diagram in FIG. 5.

The effective phase evolution in both sub-volumes S1 and S2 starts at the time t1: The phase evolves in the sub-volume S1 according to $\varphi 1(t)=\Delta\omega(S1)(t-t1)$, and in the sub-volume S2 according to $\varphi 2(t)=\Delta\omega(S2)(t-t1)$.

The excitation of the two sub-volumes S1 and S2 can be applied, as shown above, by the complex-valued superposition HF12'(t) of locally optimized RF pulse waveforms HF1'(t) and HF2'(t).

At the start of the RF refocusing pulse, i.e. at the time t2, the phase in the sub-volume S1 has evolved to $$\varphi 1(t2)=\Delta\omega(S1)(t2-t1),$$

and in the sub-volume S2 to $\varphi 2(t2)=\Delta\omega(S2)(t2-t1)$.

An additional phase offset is accordingly taken into account for the RF refocusing pulses HFR. In a similar way to the example given above, the RF pulse waveform of the refocusing pulses HFR is first modulated in order to excite and/or manipulate the respective sub-volumes:

Modulation of the RF pulse waveform for excitation of S1:

$$HFR1(t)=HFR(t)*\exp(i\gamma GSRz1t).$$

Modulation of the RF pulse waveform for excitation of S2:

$$HFR2(t)=HFR(t)*\exp(i\gamma GSRz2t),$$

where GSR represents the slice selection gradient during refocusing.

In order that a relative phase optimized for the local field variation $\Delta B0(Sn)$ can be active for each sub-volume S1, S2, and hence the sub-sequences can each be locally optimized for each effective volume of an associated sub-volume, for the correction for the field variation, this can again be taken into account by an additional modulation.

This gives for the sub-volume S1:

$$HFR1'(t)=HFR(t)*\exp(i\Delta\omega(S1)t+\varphi 1(t2)),$$

and similarly for the sub-volume S2:

$$HFR2'(t)=HFR(t)*\exp(i\Delta\omega(S2)t+\varphi 2(t2)).$$

At the start of the first echo signal, i.e. at the time t3, the phases have evolved further to $$\varphi 1(t3)=\Delta\omega(S1)(t3-t1) \text{ and } \varphi 2(t3)=\Delta\omega(S2)(t3-t1).$$

This additional phase term can easily be taken into account in the modification to the receive signal presented above, resulting in the expressions below for the optimized receive signals in the sub-volumes S1 and S2.

Correction for the field variation in S1:

$$E\_S1'(t)=E\_S1(t)*\exp(i\Delta\omega(S1)t+\varphi 1(t3)),$$

and in S2:

$$E\_S2'(t)=E\_S2(t)*\exp(i\Delta\omega(S2)t+\varphi 1(t3)).$$

At the start of the second echo signal, at the time t4, the local phases are given by $\varphi 1(t4)=\Delta\omega(S1)(t4-t1)$ and $\varphi 2(t4)=\Delta\omega(S2)(t4-t1)$, which can be taken into account in the same way.

If the different sub-volumes are excited successively and/or the echo signals are received successively (as e.g. in simultaneous echo refocusing), this can be taken into account simply by the start times for the RF pulses and/or for data reception, which start times have each been offset and adjusted with respect to the actual start times of the corresponding excitation and/or corresponding reception.

The optimization relating to the relative phases can be used, for example, to improve the spatial imaging accuracy along the phase encoding direction (e.g. for echo planar imaging EPI).

The examples of optimizations mentioned so far that are possible using the method focus on the local variations in the mean B0 field. In particular in these examples, when generating the control signals, RF pulses of the sub-sequences are modified in a way that takes into account local B0 field variations and corrects for these as far as possible in order to increase the quality of the acquired measurement data.

The method can also be used to generate the control signals in a way that corrects for local variations in the B1 field of the RF pulses, and to optimize the sub-sequences also with respect to the B1 field locally for each effective volume.

In this regard, another example is considered in which again initially only one sub-volume S1 is acquired using a known dynamic adjustment technique. It should be assumed here that in this sub-volume S1 there is a variation in the mean B1 transmission field (in particular relative to a spatial acquisition region for an e.g. additionally performed static adjustment).

If the mean B1 amplitude variation for a desired amplitude of B1 (which can also be considered as a reference) in this sub-volume S1 is ΔB1(S1), then e.g. using a known technique for dynamic adjustment of the waveform of an RF pulse, scaling can be performed by a factor $$F(S1)=1/(1+(\Delta B1(S1)/B1)).$$

For acquisition of a second sub-volume S2 at a separate instant in time, the waveform of the RF pulses could be scaled similarly by a factor F(S2)

$$F(S2)=1/(1+(\Delta B1(S2)/B1)).$$

If e.g. in a method according to the invention both sub-volumes S1 and S2 are meant to be manipulated simultaneously by RF pulses, again for the known techniques at best a compromise would be possible that provides a common (global) setting for the two sub-volumes which, however, just cannot be entirely optimum for each sub-volume individually (locally).

Only with a method according to the invention is it possible for a plurality of sub-volumes Sn (n=1, 2, 3, ... ) to be manipulated simultaneously, to determine simultaneously in all the sub-volumes an RF pulse scaling factor F(Sn)=1/(1+(ΔB1(Sn)/B1)) which is locally optimum for each sub-volume, and to generate corresponding control signals.

The following example shows a possible procedure for this.

In an exemplary embodiment, again an adjustment to the NCO can be made e.g. on the basis of a known technique for static adjustment or can be made to a mean value.

In order to make the RF pulses active in the different sub-volumes, e.g. S1 and S2, the respective RF pulse waveforms can be modulated as described above. Again this yields for S1: HF1(t)=HF(t)*exp(iγGS z1 t), and for S2: HF2(t)=HF(t)*exp(iγ GS z2 t).

In order that an RF pulse current distribution optimized for the local field variation ΔB1(Sn) can be active for each sub-volume Sn, and hence the sub-sequences can each be locally optimized for each effective volume of an associated sub-volume, for the correction for the field variation, this can be taken into account by the RF pulse scaling factor F(Sn) that is optimum for each sub-volume. The locally optimized waveforms of the RF pulses HFn'(t) for each of the n sub-volumes, which waveforms are generated on the basis of the sequence control data relevant here, and on the basis of the determined underlying physical conditions, specifically in this case ΔB1(Sn), are expressed as follows:

$$Sn: HFn'(t)=F(Sn)*HFn(t).$$

This correction for field variations in the alternating RF field B1 can be combined readily with the above-described correction for field variations in the basic magnetic field B0. Combining the procedures presented for correcting for field variations in the B1 field and in the B0 field yields for each sub-volume Sn:

$$HFn'(t)=F(Sn)*HFn(t)*\exp(i\Delta\omega(Sn)t).$$

If the sub-volumes Sn are excited or otherwise manipulated successively (such as e.g. in simultaneous echo refocusing), these values can already be used for the optimized generation of the control signals ST, as discussed above in relation to correcting for variations in the B0 field.

If the sub-volumes Sn are excited simultaneously, the locally optimized waveforms can be superimposed in complex form in order to obtain optimum conditions for each sub-volume. The waveform of the associated RF pulse is then expressed again as:

$$HF12'(t)=HF1'(t)+HF2'(t).$$

The frequency modulation (exp(iγ GS zn t)) needed to set the position of the particular sub-volume again either can be included in the RF pulse waveform by the calculation given immediately above and/or can be taken into account in the setting of the NCO.

Optimization of the control signals in this way in order to correct for local variations in the B1 field can be used, for example, to improve the spatial contrast inhomogeneity (both inside each sub-volume and between the sub-volumes, in particular slices) and the SNR (signal-to-noise ratio).

If the RF antenna 7 of the magnetic resonance apparatus 1 used to acquire the measurement data has multiple channels, in particular for transmitting RF pulses, it is possible to perform the above-described adaptations of the center frequency, of the RF pulse scaling factors and of the RF pulse current distribution also individually for each channel i that is used. It is thereby possible to optimize for a plurality of simultaneously manipulated sub-volumes not only the mean variation in the B0 field and/or B1 field but also the local homogeneity of the B1 field.

In a similar way to the above examples, when considering individual channels i of the RF unit, for the modulation of the RF pulse waveform in order to manipulate the sub-volume Sn, an expression for an RF pulse current distribution is initially obtained as:

HFn(i,t)=HF(i,t)*exp(iγ GS zn t), where the NCO can be set initially e.g. to a mean value or using a known static adjustment technique.

The above-described options for correcting for field variations in the B0 field and/or in the B1 field can likewise be applied to local optimization of the sub-sequences in each case for each effective volume of an associated sub-volume.

For correcting for field variations in the B0 field and in the B1 field in a sub-volume Sn, e.g. an RF pulse current distribution is hence given by:

$$HFn'(i,t)=F(i,Sn)*HFn(i,t)*\exp(i\Delta\omega(Sn)t).$$

If the RF pulses are meant to be emitted simultaneously, a complex-valued superposition can again be performed. For instance for two sub-volumes S1 and S2:

$$HF12'(i,t)=HF1'(i,t)+HF2'(i,t).$$

It should be noted that the RF pulse waveform RF(i,t) has a complex value for each individual channel i and can appear differently in magnitude and phase. Likewise, the channel-specific correction factor F(i) here has a complex value in the described local optimized adaptation of the amplitudes and phases of the RF pulses.

If, unlike the assumption in the last examples, the effective volumes are not identical to the respective sub-volumes, the considerations apply analogously to the effective volumes instead of the sub-volumes. Likewise, the invention can be extended analogously to more than two sub-volumes Sn.

Thus the presented method makes it possible, by suitable generation of the control signals, to correct for various perturbations in the underlying conditions, such as variations in the B0 field and/or in the B1 field, effectively and independently in the sub-volumes, even for simultaneous manipulation of at least two sub-volumes by execution of a sub-sequence.

It is also readily possible to combine said method with one or more known dynamic and also static adjustment techniques.

By execution of a sub-sequence, at least three sub-volumes S1, S2, S3 can be simultaneously manipulated and/or used to acquire the measurement data.

Figure 3:
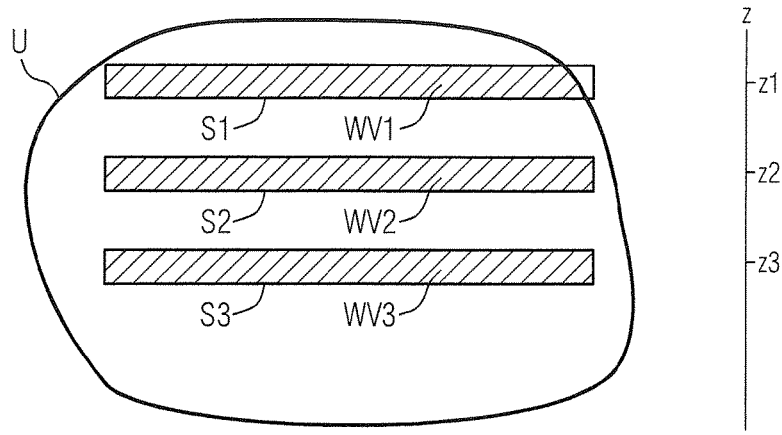
FIG. 3 shows a subject under examination containing three examples of spatially separate sub-volumes.

FIG. 3 shows schematically a subject under examination U, in which three sub-volumes S1, S2, S3 are simultaneously manipulated and/or used to acquire the measurement data by means of a sub-sequence. In the example shown, each sub-volume S1, S2, S3 corresponds to one slice of the subject under examination U, where the slices S1, S2, S3 are arranged at different positions z1, z2, and z3 in the z-direction. The illustrated example shows a situation in which part of the sub-volume S1 lies outside the subject under examination U (top right). If the position, orientation and extent of the subject under examination U are known, e.g. from a pre-measurement such as a calibration measurement, the effective volume WV1 (shown hatched) belonging to the sub-volume S1 can be restricted to the part of the sub-volume S1 that lies inside the subject under examination U. In the case of the sub-volumes S2 and S3 shown, the associated effective volumes WV2 and WV3 respectively (each shown hatched) each correspond to the associated sub-volume S2 and S3 respectively. In principle, however, further restrictions on the effective volumes WV1, Wv2, wv3 are also possible here, for instance as a result of restrictions known from the control protocol regarding regions of interest (ROIs) and/or regions in which e.g. saturation is required.

Although modifications and changes may be suggested by those skilled in the art, it is the intention of the inventor to embody within the patent warranted hereon all changes and modifications as reasonably and properly come within the scope of his contribution to the art.

The invention claimed is:

1. A method for acquiring magnetic resonance measurement data from a subject, comprising:
   loading a control protocol into a control computer of a magnetic resonance apparatus, said control protocol causing said control computer to operate a magnetic resonance data acquisition scanner of the apparatus to acquire magnetic resonance data from a subject in a data acquisition sequence;
   in said control computer, automatically determining sequence control data that are relevant to the control protocol, said sequence control data defining different functional sub-sequences of said acquisition sequence, wherein said sub-sequences cause nuclear spins in at least two sub-volumes of the subject to be simultaneously manipulated or used to acquire said magnetic resonance data;
   in said control computer, for each functional sub-sequence, determining a respective effective volume dependent on the sub-volumes that are associated with the respective sub-sequence;
   in said control computer, for each effective volume, individually determining applicable underlying conditions that exist in the data acquisition scanner for the determined sequence control data and for the respective effective volumes determined for the associated sub-volumes;
   in said control computer, generating control signals for operating said data acquisition scanner from said sequence control data, said effective volumes, and said underlying conditions in order to perform said acquisition sequence with the respective sub-sequences being individually locally optimized for each effective volume of an associated sub-volume; and
   making the generated control signals available from the control computer in electronic form while operating the data acquisition scanner.

2. A method as claimed in claim 1 comprising generating the control signals by adapting at least one parameter of the sequence control data for each effective volume of each sub-volume of a sub-sequence.

3. A method as claimed in claim 2 comprising selecting said parameters to be adapted from the group consisting of a center frequency of a radio frequency (RF) pulse radiated in said acquisition sequence, RF pulse scaling factors for RF pulses radiated in said acquisition sequence, and an RF pulse current distribution for an RF pulse radiated in said acquisition sequence.

4. A method as claimed in claim 2 comprising generating control signals by superimposing parameters of the sequence control data that are adapted for each effective volume of each sub-volume of a sub-sequence.

5. A method as claimed in claim 1 comprising determining said sequence control data to define transmission of radio frequency (RF) pulses of the respective sub-sequences.

6. A method as claimed in claim 5 wherein said RF pulses of the respective sub-sequences comprise at least one RF pulse selected from the group consisting of RF excitation pulses, RF refocusing pulses, RF suppression pulses, RF inversion pulses, RF labelling pulses, and complex RF pulses.

7. A method as claimed in claim 1 comprising generating said sequence control data to define reception of said magnetic resonance data in a sub-sequence.

8. A magnetic resonance apparatus comprising:
   a magnetic resonance data acquisition scanner;
   a control computer loaded with a control protocol that causes said control computer to operate the data acquisition scanner to acquire magnetic resonance data from a subject in a data acquisition sequence;
   said control computer being configured to automatically determine sequence control data that are relevant to the control protocol, said sequence control data defining different functional sub-sequences of said acquisition sequence, wherein said sub-sequences cause nuclear spins in at least two sub-volumes of the subject to be simultaneously manipulated or used to acquire said magnetic resonance data;
   said control computer being configured to determine for each functional sub-sequence, a respective effective volume dependent on the sub-volumes that are associated with the respective sub-sequence;
   said control computer being configured to determine for each effective volume, individually applicable underlying conditions that exist in the data acquisition scanner for the determined sequence control data and for the respective effective volumes determined for the associated sub-volumes;
   said control computer being configured to generate control signals for operating said data acquisition scanner from said sequence control data, said effective volumes, and said underlying conditions in order to perform said acquisition sequence with the respective sub-sequences being individually locally optimized for each effective volume of an associated sub-volume; and said control computer being configured to use the generated control signals to operate the data acquisition scanner.

9. A non-transitory, computer-readable data storage medium encoded with programming instructions, said storage medium being loaded into a control computer of a magnetic resonance apparatus that comprises a magnetic resonance data acquisition scanner, and said programming instructions causing said control computer to:

receive a control protocol that causes said control protocol causing said control computer to operate the data acquisition scanner to acquire magnetic resonance data from a subject in a data acquisition sequence;

determine sequence control data that are relevant to the control protocol, said sequence control data defining different functional sub-sequences of said acquisition sequence, wherein said sub-sequences cause nuclear spins in at least two sub-volumes of the subject to be simultaneously manipulated or used to acquire said magnetic resonance data;

for each functional sub-sequence, determine a respective effective volume dependent on the sub-volumes that are associated with the respective sub-sequence;

determine for each effective volume, individually applicable underlying conditions that exist in the data acquisition scanner for the determined sequence control data and for the respective effective volumes determined for the associated sub-volumes;

generate control signals for operating said data acquisition scanner from said sequence control data, said effective volumes, and said underlying conditions in order to perform said acquisition sequence with the respective sub-sequences being individually locally optimized for each effective volume of an associated sub-volume; and use the generated control signals to operate the data acquisition scanner.

* * * * *